US010665680B2

(12) United States Patent
Odekirk et al.

(10) Patent No.: US 10,665,680 B2
(45) Date of Patent: May 26, 2020

(54) METHOD AND ASSEMBLY FOR OHMIC CONTACT IN THINNED SILICON CARBIDE DEVICES

(71) Applicant: Microsemi Corporation, Aliso Viejo, CA (US)

(72) Inventors: Bruce Odekirk, Bend, OR (US); Jacob Alexander Soto, Bend, OR (US)

(73) Assignee: Microsemi Corporation, Chandler, AZ (US)

( * ) Notice: Subject to any disclaimer, the term of this patent is extended or adjusted under 35 U.S.C. 154(b) by 0 days.

(21) Appl. No.: 16/190,730

(22) Filed: Nov. 14, 2018

(65) Prior Publication Data
US 2019/0157397 A1    May 23, 2019

Related U.S. Application Data

(60) Provisional application No. 62/589,138, filed on Nov. 21, 2017.

(51) Int. Cl.
*H01L 21/04* (2006.01)
*H01L 29/16* (2006.01)
(Continued)

(52) U.S. Cl.
CPC .... *H01L 29/1608* (2013.01); *H01L 21/02378* (2013.01); *H01L 21/0485* (2013.01);
(Continued)

(58) Field of Classification Search
CPC ......... H01L 21/02365; H01L 21/02518; H01L 21/048; H01L 29/66007
See application file for complete search history.

(56) References Cited

U.S. PATENT DOCUMENTS

| 7,547,578 B2 | 6/2009 | Agarwal et al. |
| 8,216,929 B2 | 7/2012 | Kawai et al. |
| (Continued) | | |

FOREIGN PATENT DOCUMENTS

| JP | 2009283754 A | 12/2009 |
| JP | 2016046309 A | 4/2016 |

OTHER PUBLICATIONS

Rupp, et al., "Laser backside contact annealing of SiC Power devices: A Prerequisite for SiC thin wafer technology", Proceedings of the 25th International Symposium on Power Semiconductor Devices & ICs, Kanazawa, Infineon Technologies, Villach, Austria, date unknown.

(Continued)

*Primary Examiner* — Cheung Lee
(74) *Attorney, Agent, or Firm* — Glass and Associates; Kenneth Glass; Kenneth D'Alessandro

(57) ABSTRACT

A silicon carbide semiconductor assembly and a method of forming a silicon carbide (SiC) semiconductor assembly are provided. The silicon carbide semiconductor assembly includes a semiconductor substrate and an electrode. The semiconductor substrate is formed of silicon carbide and includes a first surface, a second surface opposing the first surface, and a thickness extending therebetween. The method includes forming one or more electronic devices on the first surface and thinning the semiconductor substrate by removing the second surface to a predetermined depth of semiconductor substrate and leaving a third surface opposing the first surface. The method further includes forming a non-ohmic alloy layer on the third surface at a first temperature range and annealing the alloy layer at a second temperature range forming an ohmic layer, the second temperature range being greater than the first temperature range.

14 Claims, 2 Drawing Sheets

(51) Int. Cl.
| | |
|---|---|
| H01L 29/45 | (2006.01) |
| H01L 21/285 | (2006.01) |
| H01L 21/324 | (2006.01) |
| H01L 23/532 | (2006.01) |
| H01L 21/02 | (2006.01) |
| H01L 21/304 | (2006.01) |
| H01L 21/268 | (2006.01) |

(52) U.S. Cl.
CPC ........ *H01L 21/2855* (2013.01); *H01L 21/324* (2013.01); *H01L 23/53209* (2013.01); *H01L 29/45* (2013.01); *H01L 21/268* (2013.01); *H01L 21/304* (2013.01)

(56) References Cited

U.S. PATENT DOCUMENTS

| | | |
|---|---|---|
| 8,440,524 B2 | 5/2013 | Fujiwara et al. |
| 8,941,122 B2 | 1/2015 | Kawai et al. |
| 8,962,468 B1 | 2/2015 | Hostetler |
| 9,105,558 B2 | 8/2015 | Kawai et al. |
| 9,263,267 B2 | 2/2016 | Kawai et al. |
| 9,384,981 B2 | 7/2016 | Tamaso et al. |
| 2008/0230911 A1 | 9/2008 | Li |
| 2015/0371856 A1 | 12/2015 | Kitabayashi |
| 2016/0056041 A1 | 2/2016 | Tamaso et al. |
| 2017/0271157 A1 | 9/2017 | Utsumi et al. |

OTHER PUBLICATIONS

International Search Report and Written Opinion, PCT/US2018/060999, dated Feb. 12, 2019., Feb. 12, 2019.

Vladimir Scarpa, Uwe Kirchner, Rolf Gerlach, and Ronny Kern, New SiC Thin-Wafer Technology Paving the Way of Schottky Diodes with Improved Performance and Reliability, Infineon Technologies, Villach, Austria, 5 pages.

R.Rupp, R. Kern, and R. Gerlach, Laser backside contact annealing of SiC Power devices: A Prerequisite for SiC thin wafter technology, Proceedings of the 25th International Symposium on Power Semiconductor Devices & IC's, Kanazawa, Villach Austria, pp. 51-54.

F.Mazzamuto, S. Halty, H Tanimura and Y. Mori, Low thermal budget ohmic contact formation by laser anneal, Screen Semiconductor Solutions, Hikone, Shiga, Japan, 4 pages.

METHOD AND ASSEMBLY FOR OHMIC CONTACT IN THINNED SILICON CARBIDE DEVICES

CROSS REFERENCE TO RELATED APPLICATION

This application claims priority to and the benefit of U.S. Provisional Application No. 62/589,138, filed Nov. 21, 2017, which is incorporated by reference herein in its entirety.

BACKGROUND

This description relates to semiconductor devices and fabrication of semiconductor devices, and more specifically to methods of forming an ohmic contact on a thinned silicon carbide (SiC) semiconductor device and such devices.

Silicon Carbide (SiC) is a wide-band gap (WBG) semiconductor material that has material properties that make it suitable for high voltage, high power semiconductor devices. SiC substrates on which semiconductor devices are built start out approximately 350 µm thick. This thickness does not allow heat generated during device operation to dissipate fast enough to maintain predetermined operating temperatures. Therefore, the device is de-rated or auxiliary cooling is provided to ensure efficient device operation, which increases overall system level cost.

A primary advantage of SiC power electronic components is that very high power densities can be obtained in small footprint devices, enabling smaller, faster and more efficient power switching devices. A major challenge imposed by these high power density devices is the requirement to provide adequate thermal management in the packaged device. Without adequate thermal management, the power rating of the device falls far short of the intrinsic capability of the semiconductor. A key method for providing enhanced thermal management is to thin the semiconductor die after wafer processing on the device-side is complete to obtain a total thickness in the range of 75-200 µm.

Increasing wafer diameter leads to increasing thickness of the wafers for strength during processing. The contrasting interest of thinner dies for performance reasons makes wafer thinning techniques more and more important.

The formation of an ohmic contact (typically a silicide) on a back-side of a thinned SiC wafer, after the device-side processing has been completed, without damaging the device-side components poses challenges. Proper ohmic contact formation requires temperatures >1000° C. and is easy to complete when wafers are not thinned, as the temperature exposure is done early on in the process flow, before any die have structures or materials that can be damaged by high temperature because the melting point of some device-side materials begins around 600° C.

Laser annealing isolates high temperatures to a shallow region on the backs of thinned wafers, which prevents high temperatures from affecting vulnerable structures and/or materials. Controlling temperature such that the metal film needed to convert to silicide remains and is not ablated is a challenge for ohmic contact formation.

Laser anneal ablating causes some of the deposited films needed for silicide formation to be removed and no longer available for ohmic contact formation. Keeping the bulk film layer for complete silicide formation is a challenge with current laser anneal applications.

BRIEF DESCRIPTION

In one embodiment, a method of forming a silicon carbide (SiC) semiconductor assembly that includes a semiconductor substrate and an electrode is provided. The semiconductor substrate is formed of silicon carbide and includes a first surface, a second surface opposing the first surface, and a thickness extending therebetween. The method includes forming one or more electronic devices on the first surface and thinning the semiconductor substrate by removing the second surface to a predetermined depth of the semiconductor substrate and leaving a third surface opposing the first surface. The method further includes forming a non-ohmic alloy layer on the third surface at a first temperature range and annealing the alloy layer at a second temperature range forming an ohmic layer, the second temperature range being greater than the first temperature range.

In another embodiment, a method of forming a semiconductor assembly includes forming one or more electronic devices on a first surface of a substrate. The substrate is formed of a silicon carbon (SiC) material and has a first thickness defined between the first surface and a second surface opposing the first surface. The method also includes thinning the semiconductor substrate using a mechanical grinding process on the second surface of the substrate to a second thickness. The second thickness is defined between the first surface and a third surface of the substrate formed by the mechanical grinding process. The method further includes applying a metal film to the third surface, converting the metal film to a non-ohmic alloy layer on the third surface by heating the metal film to a first temperature range for a predetermined period of time, and annealing the non-ohmic alloy layer using localized heating of predetermined portions of the third surface by laser energy directed at the predetermined portions to form an ohmic contact layer.

In yet another embodiment, a silicon carbide semiconductor assembly includes a substrate layer formed of a first conductivity type silicon carbide semiconductor material, the substrate layer comprising a first surface, a second surface on an opposite side of the substrate layer from the first surface, and a first thickness of the substrate layer extending therebetween. The silicon carbide semiconductor assembly also includes one or more electronic devices formed on the first surface and an ohmic layer of a second phase of a metal silicide formed on a third surface of the substrate layer, the third surface formed when the second surface is removed from the substrate layer leaving a second thickness of the substrate layer. The ohmic layer of metal silicide is converted from a non-ohmic layer of first phase of metal silicide. The non-ohmic layer of metal silicide is formed in a relatively low temperature alloy heating process from a layer of metal deposited onto the second surface. The ohmic layer of metal silicide is converted from the non-ohmic layer of metal silicide using a relatively high temperature local heating source.

Figure 1:
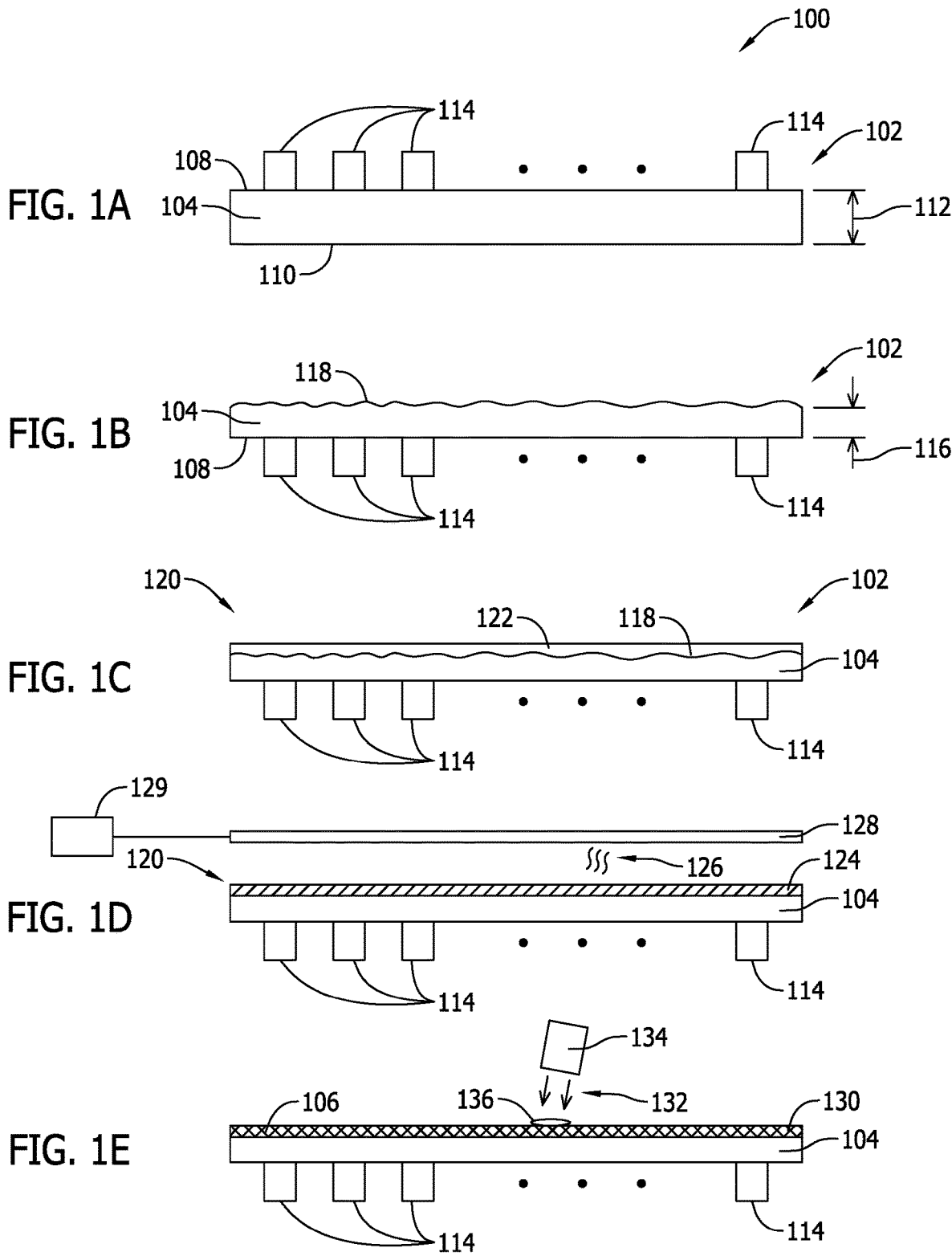
FIGS. 1A-1E illustrate a sequence of views of a process of forming a silicon carbide (SiC) semiconductor assembly in accordance with an example embodiment of the present disclosure.

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

The following detailed description illustrates embodiments of the disclosure by way of example and not by way of limitation. It is contemplated that the disclosure has general application to silicon carbide semiconductor devices in a plurality of different applications.

Embodiments of a silicon carbide thinned wafer electronic device are described herein. As described in detail below, during the manufacture of silicon carbide semiconductor devices, wafers of a particular thickness are typically used. The thickness selected permits the wafer to be handled without breakage during the manufacturing process. However, such thickness, in a finished product would adversely affect the performance of the devices formed on the wafer.

After forming devices on a device-side of a silicon carbide wafer or substrate, the silicon carbide substrate is thinned or reduced in a thickness dimension, in some embodiments, using a known mechanical grinding, lapping, or chemical/mechanical polishing process to remove some of the thickness of the silicon carbide substrate from a back-side surface. For example, a silicon carbide substrate that starts out at approximately 375 microns thickness may be reduced to between approximately 75 microns and approximately 250 microns by the mechanical grinding process. The remaining surface may have a roughness of approximately three nanometers to approximately one hundred nanometers of roughness average (RA).

After wafers are thinned, a thin metal film is deposited on the remaining surface. In various embodiments, the metal film includes nickel (Ni). A low temperature alloy process is completed to form a non-ohmic nickel silicide phase, such as, $Ni_2Si$. As an example, the low temperature alloy can be performed in a conventional annealing furnace in the temperature range of, for example, between approximately 400° C. and approximately 500° C. in a non-oxidizing environment such as nitrogen, argon, and/or hydrogen. The low temperature formed nickel silicide $Ni_2Si$ is then subjected to laser annealing, which locally heats specific areas to >1000° C., using a directed laser energy source, to complete the $Ni_2Si$ conversion into another phase of nickel silicide applicable for ohmic contact, such as, NiSi. Because the intermediate $Ni_2Si$ phase was performed previously, the laser energy required to complete the ohmic contact formation can be sufficiently low to prevent any material ablation.

Performing laser anneal on a metallic surface causes some of the laser energy to reflect away from the interface to be annealed; a metallic surface is not transparent enough to transmit the majority of energy into the reaction (most of the unreflected light is absorbed in the metal film).

In the presently described process, the low temperature silicide $Ni_2Si$ is more stable to laser exposure than a deposited metal film on a SiC substrate surface. The low temperature silicide $Ni_2Si$ has less reflectance and allows for more energy absorbance of the laser, thus allowing for a more complete NiSi formation. Additionally, silicides are more resistant to oxidation than a metal film, which allows for a more robust laser anneal process, such that process control becomes more robust.

A silicide typically has lower thermal conductivity than a metal film, which helps keep heat localized in the interface to be annealed and helps further mitigate heat transfer to the delicate device-side of the substrate.

The present embodiments are described in full detail, with reference to the cross sections and accompanying drawings and with emphasis on the methods to implement the main embodiments. In the cross sections and the drawings the thicknesses of various layers are not to scale but rather drawn with the intention to illustrate the scope of this disclosure.

FIGS. 1A-1E illustrate a sequence of views of a process 100 of forming a silicon carbide (SiC) semiconductor assembly 102. In the example embodiment, SiC semiconductor assembly 102 includes a semiconductor substrate 104 and an ohmic electrode 106. Semiconductor substrate 104 is formed of silicon carbide and includes a first surface 108, a second surface 110 opposing first surface 108, and a first thickness 112 extending therebetween. In the example embodiment, first thickness 112 is in the range of approximately 250 microns to approximately 450 microns. In various embodiments, first thickness 112 is in the range of approximately 300 microns to approximately 400 microns. In one embodiment, first thickness 112 is approximately 375 microns. FIG. 1A illustrates semiconductor substrate 104 after a plurality of SiC electronic devices 114 have been formed on first surface 108.

Processing of SiC semiconductor assembly 102 continues by flipping semiconductor assembly 102 over such that first surface 108 is in a vertically downward attitude and second surface 110 is in a vertically upward attitude as shown in FIG. 1B. Semiconductor substrate 104 is thinned from first thickness 112 by removing material from semiconductor substrate 104 along second surface 110 to a predetermined thickness 116 of semiconductor substrate 104 and leaving a third surface 118 opposing first surface 108. Thinning of semiconductor substrate 104 is performed after the forming of the one or more electronic devices on the first surface is complete. In the example embodiment, thickness 116 is in a range of approximately 75 microns to approximately 200 microns. In other embodiments, thickness 116 is in a range of approximately 100 microns to 175 microns. A final value of thickness 116 is dependent upon at least two competing constraints (1) if SiC semiconductor assembly 102 is thinned too much, it may be too thin for the fabrication equipment to handle or it may be too easily broken by the fabrication equipment, and (2) because SiC semiconductor assembly 102 is thinned to improve thermal performance, the least thickness 116 possible is preferred. In one embodiment, a mechanical grinding process is used to thin SiC semiconductor assembly 102. Third surface 118 may have a roughness of approximately three nanometers to approximately one hundred nanometers of roughness average (RA) after the mechanical grinding process is completed. In the example embodiment, a rough grinding process is performed. Fine grinding is not performed because, in various embodiments, a rougher surface improves subsequent steps in the formation of an ohmic contact on third surface 118.

Forming a non-ohmic alloy layer 120 on third surface 118 includes forming a layer 122 of nickel (Ni) on third surface 118, in various embodiments, by vacuum evaporation as shown in FIG. 1C. SiC semiconductor assembly 102 is then heated to a first temperature for a predetermined period of time to form a layer 124 of a first phase of nickel silicide ($Ni_2Si$), which is a non-ohmic phase of nickel silicide. Heat 126 may be applied using a heater 128. Heat 126 may be generated by, for example, but not limited to electrical resistance, flash heating lamps, or other heating methods. A controller 129, operatively coupled to heater 128 is used to control heat 126 generated by heater 128. The nickel of layer 122 combines with SiC of semiconductor substrate 104 to yield $Ni_2Si$. The nickel and SiC may pass through various stoichiometries of nickel silicide before reaching the desired combination of $Ni_2Si$. This formation of non-ohmic alloy layer 124 is an intermediate step performed at a relatively low temperature of approximately 400° C. to approximately 950° C. In other embodiments, semiconductor substrate 104 is heated to a range of approximately 400° C. to approximately 500° C. In still other embodiments, semiconductor substrate 104 is heated to a range of approximately 420° C. to approximately 470° C. Controller 129 is configured to receive the above temperature ranges and to maintain a temperature of SiC semiconductor assembly 102 within the temperature range selected. Using the relatively low first temperature to form $Ni_2Si$ allows heating semiconductor substrate 104 without damaging the already formed and completed SiC electronic devices 114. As indicated above during the heating, silicon from semiconductor substrate 104 and nickel from layer 122 combine to form $Ni_2Si$ layer 124.

To further form an ohmic contact layer 130 on semiconductor substrate 104, $Ni_2Si$ layer 124 is annealed to form a layer 130 of a second phase of nickel silicide (NiSi) as shown in FIG. 1E. NiSi forms an ohmic bond at a second temperature that is a higher temperature than the first temperature, for example, >1000° C. To avoid heating and damaging the already formed and completed SiC electronic devices 114 while heating $Ni_2Si$ layer 124 during the annealing process, localized heating is used in short bursts with a time period between bursts to allow the heat to dissipate before being able to heat SiC electronic devices 114. In various embodiments, the localized heating is applied using modulated laser energy 132 from a laser device 134, for example, from a xenon chloride laser operating at approximately 307 nanometers in wave length. Other laser types may also be used such as, but not limited to excimer lasers and other lasers operating in or near the ultraviolet (UV) end of the electromagnetic spectrum. In various embodiments, laser annealing is performed by directing laser energy to a path 136 (shown in FIG. 1E) on $Ni_2Si$ layer 124 (shown in FIG. 1D), which converts non-ohmic $Ni_2Si$ layer 124 to ohmic NiSi layer 130 (shown in FIG. 1E). Annealing not only provides the energy for converting $Ni_2Si$ layer 124 to NiSi layer 130, but also remediates at least a portion of damage to semiconductor substrate 104 caused by the grinding process. Laser energy 132 may be directed to $Ni_2Si$ layer 124 in a predetermined path across $Ni_2Si$ layer 124. The predetermined path can take any form, for example, the predetermined path may be serpentine, or geometric, such as, a raster of various configurations. The path may be discontinuous or continuous.

Figure 2:
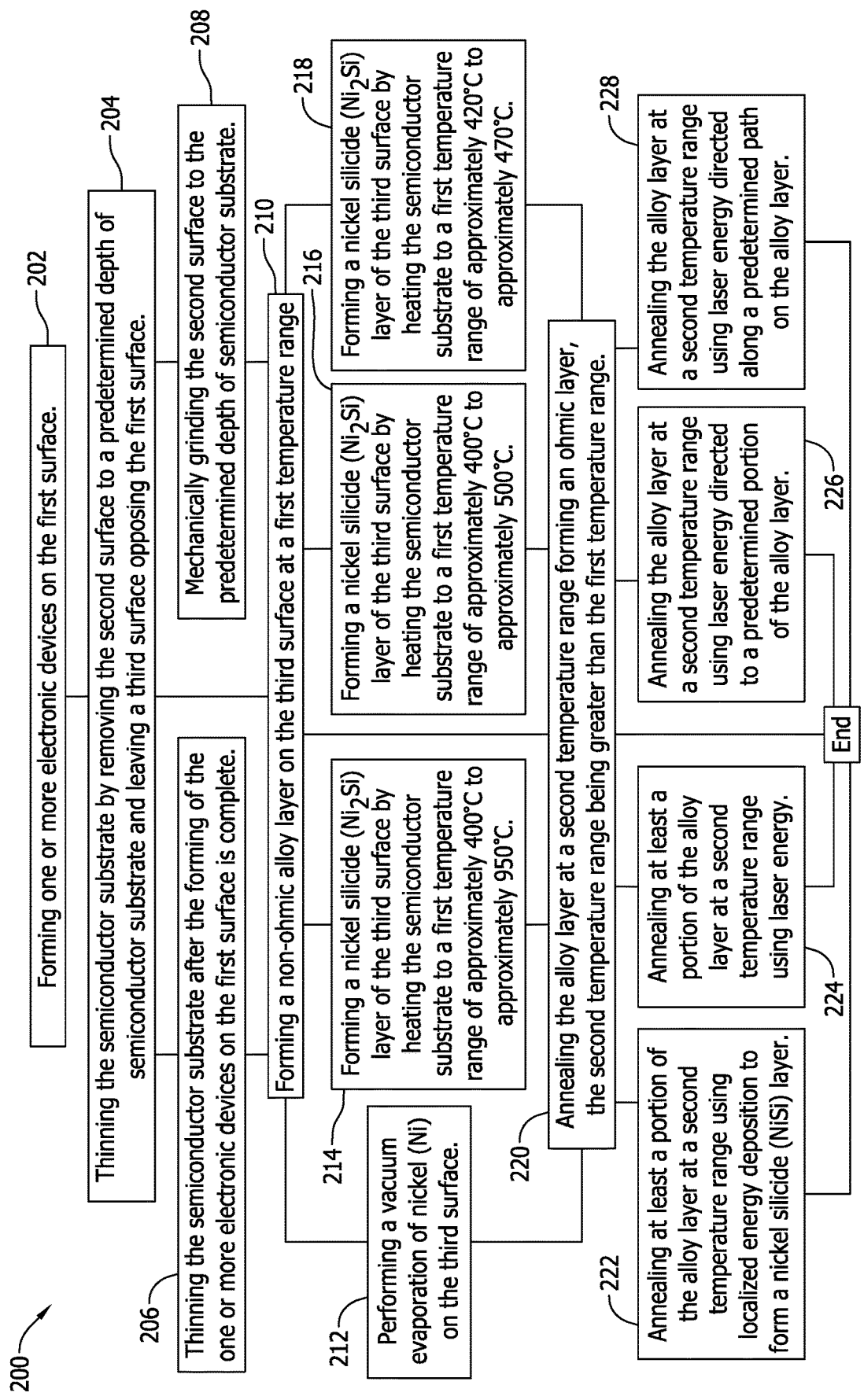
FIG. 2 is a flow chart of a method of forming a silicon carbide (SiC) semiconductor assembly that includes a semiconductor substrate and an electrode.

FIG. 2 is a flow chart of a method 200 of forming a silicon carbide (SiC) semiconductor assembly that includes a semiconductor substrate and an electrode. In the example embodiment, the semiconductor substrate is formed of silicon carbide and includes a first surface, a second surface opposing the first surface, and a thickness extending between the first surface and the second surface. The method includes forming 202 one or more electronic devices on the first surface and thinning 204 the semiconductor substrate by removing the second surface to a predetermined depth of semiconductor substrate and leaving a third surface opposing the first surface. Optionally, method 200 includes thinning 206 the semiconductor substrate after the forming 202 of the one or more electronic devices on the first surface is complete. Thinning 204 also optionally includes mechanically grinding 208 the second surface to the predetermined depth of semiconductor substrate.

Method 200 also includes forming 210 a non-ohmic alloy layer on the third surface at a first temperature range. Optionally, method 200 includes performing 212 a vacuum evaporation of nickel (Ni) on the third surface. Method 200 may also include forming 214 a nickel silicide ($Ni_2Si$) layer of the third surface by heating the semiconductor substrate to a first temperature range of approximately 400° C. to approximately 950° C. Method 200 may further include forming 216 a nickel silicide ($Ni_2Si$) layer of the third surface by heating the semiconductor substrate to a first temperature range of approximately 400° C. to approximately 500° C. Method 200 may optionally include forming 218 a nickel silicide ($Ni_2Si$) layer of the third surface by heating the semiconductor substrate to a first temperature range of approximately 420° C. to approximately 470° C.

Method 200 further includes annealing 220 the non-ohmic alloy layer at a second temperature range forming an ohmic layer, the second temperature range being greater than the first temperature range. Method 200 optionally includes annealing 222 at least a portion of the alloy layer at a second temperature range using localized energy deposition to form a nickel silicide (NiSi) layer. At least a portion of the alloy layer may also be annealed 224 at a second temperature range using laser energy. Optionally, method 200 also includes annealing 226 the alloy layer at a second temperature range using laser energy directed to a predetermined portion of the alloy layer. Method 200 optionally includes annealing 228 the alloy layer at a second temperature range using laser energy directed along a predetermined path on the alloy layer.

In the example embodiment, the non-ohmic alloy layer is formed by first performing a vacuum evaporation of nickel (Ni) on the third surface and then heating the SiC semiconductor assembly to a first temperature range of approximately 400° C. to approximately 950° C. This first temperature range is selected to protect the one or more electronic devices on the first surface from heat damage while converting the nickel film to a non-ohmic nickel silicide alloy layer formed mostly of nickel silicide of the $Ni_2Si$ phase. In the example embodiment, the non-ohmic alloy layer is annealed 220 at a second temperature range, which is higher than the first temperature range, using localized energy deposition to form an ohmic nickel silicide (NiSi) layer.

As described above, thinning 204 the semiconductor substrate is performed after the forming of the one or more electronic devices on the first surface is complete. During the forming, the semiconductor substrate is maintained at approximately 375 microns to permit easier handling by the fabrication equipment. After the formation of the one or more electronic devices on the first surface, the SiC semiconductor assembly is flipped over and the second surface is mechanically ground until the semiconductor substrate is approximately 75 to approximately 200 microns thick. Thinning 204 the semiconductor substrate improves the electrical characteristics of the SiC semiconductor assembly.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The above-described embodiments of a silicon carbide (SiC) semiconductor assembly and method of fabricating the SiC semiconductor assembly provides a cost-effective and reliable means for forming an ohmic contact on a thinned SiC substrate. More specifically, the assembly and method described herein facilitate forming the ohmic contact in a two-step heating process that protects electronic devices already formed on the SiC substrate and anneals the SiC substrate that may have incurred an amount of damage from a grinding process. As a result, the assembly and method described herein facilitate improving the fabrication and operation of SiC devices in a cost-effective and reliable manner.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a semiconductor assembly, said method comprising:
    forming one or more electronic devices on a first surface of a semiconductor substrate formed of a silicon carbon (SiC) material and having a first thickness defined between the first surface and a second surface opposing the first surface;
    thinning the semiconductor substrate using a mechanical grinding process on a second surface of the substrate to a second thickness, the second thickness defined between the first surface and a third surface of the substrate formed by the mechanical grinding process;
    applying a metal film to the third surface;
    converting the applied metal film to a non-ohmic alloy layer on the third surface by heating to a first temperature between 400° C. and 950° C. for a predetermined period of time; and
    annealing the converted non-ohmic alloy layer at a temperature higher than the first temperature.

2. The method of claim 1, wherein thinning the semiconductor substrate comprises thinning the semiconductor substrate after the forming of the one or more electronic devices on the first surface is complete.

3. The method of claim 1, wherein thinning the semiconductor substrate comprising mechanically grinding the second surface to the predetermined depth of semiconductor substrate.

4. The method of claim 1, wherein applying the metal film to the third surface comprises performing a vacuum evaporation of nickel (Ni) on the third surface.

5. The method of claim 1, wherein converting the applied metal film to the non-ohmic alloy layer on the third surface comprises forming a nickel silicide ($Ni_2Si$) layer of the third surface by heating the semiconductor substrate to a temperature between approximately 400° C. to approximately 500° C.

6. The method of claim 1, wherein converting the applied metal film to the non-ohmic alloy layer on the third surface comprises forming a nickel silicide (NiSi) layer of the third surface by heating the semiconductor substrate to a temperature between approximately 420° C. to approximately 470° C.

7. The method of claim 1, wherein annealing the converted non-ohmic alloy layer comprises annealing at least a portion of the converted non-ohmic alloy layer at the temperature higher than the first temperature range using laser energy.

8. The method of claim 1, wherein annealing the converted non-ohmic alloy layer at the temperature higher than the first temperature range comprises annealing the converted non-ohmic alloy layer by using localized heating of portions of the third surface using laser energy directed to the portions of the converted non-ohmic alloy layer.

9. The method of claim 1, wherein annealing the converted non-ohmic alloy layer at the temperature higher than the first temperature range comprises annealing the converted non-ohmic alloy layer using laser energy directed along a predetermined path on the converted non-ohmic alloy layer.

10. The method of claim 1, wherein applying a metal film to the third surface comprises applying a nickel film to the third surface.

11. The method of claim 1, wherein converting the metal film to a non-ohmic alloy layer comprises converting the metal film to a non-ohmic metal silicide alloy layer.

12. The method of claim 1, wherein convening the metal film to a non-ohmic alloy layer on the third surface comprises converting a nickel film to a nickel silicide alloy.

13. The method of claim 1, wherein annealing the converted non-ohmic alloy layer comprises using localized heating by a directed laser energy source.

14. The method of claim 1, wherein annealing the converted non-ohmic alloy layer comprises heating of portions of the third surface by laser energy to a temperature greater than 1000° C.

* * * * *